United States Patent
Chen et al.

(10) Patent No.: US 11,099,235 B1
(45) Date of Patent: Aug. 24, 2021

(54) SEMICONDUCTOR DEVICE AND METHOD FOR DETECTING NEEDLE MARK SHIFTING

(71) Applicant: Winbond Electronics Corp., Taichung (TW)

(72) Inventors: Jian-Sheng Chen, Taichung (TW); Ming-Hung Lai, Taichung (TW); Ming-Huan Hsieh, Tianwei Township (TW)

(73) Assignee: WINBOND ELECTRONICS CORP., Taichung (TW)

( * ) Notice: Subject to any disclaimer, the term of this patent is extended or adjusted under 35 U.S.C. 154(b) by 9 days.

(21) Appl. No.: 16/842,105

(22) Filed: Apr. 7, 2020

(51) Int. Cl.
*G01R 31/28* (2006.01)
*G01R 1/073* (2006.01)

(52) U.S. Cl.
CPC ..... *G01R 31/2891* (2013.01); *G01R 1/07342* (2013.01); *G01R 31/2884* (2013.01)

(58) Field of Classification Search
CPC ............ G01R 31/2891; G01R 1/07342; G01R 31/2884
USPC .................................... 324/750.16, 537, 500
See application file for complete search history.

(56) References Cited

U.S. PATENT DOCUMENTS

| | | | |
|---|---|---|---|
| 6,452,807 B1 * | 9/2002 | Barrett ................. | G01R 1/0416 257/686 |
| 7,129,584 B2 * | 10/2006 | Lee ..................... | H01L 23/5387 257/778 |
| 7,915,718 B2 * | 3/2011 | Lee ..................... | H01L 23/5383 257/668 |
| 9,570,446 B1 | 2/2017 | Woo et al. | |
| 2009/0160470 A1 | 6/2009 | Reinwald et al. | |
| 2011/0001507 A1 | 1/2011 | Chang | |
| 2012/0068725 A1 | 3/2012 | Pagani | |
| 2019/0198471 A1 | 6/2019 | Ikawa et al. | |

FOREIGN PATENT DOCUMENTS

JP      2008-71999 A     3/2008

* cited by examiner

*Primary Examiner* — Giovanni Astacio-Oquendo
(74) *Attorney, Agent, or Firm* — Birch, Stewart, Kolasch & Birch LLP

(57) ABSTRACT

A semiconductor device is provided. The semiconductor device includes a first test pad and a plurality of second test pads. The first test pad includes a central portion and a plurality of peripheral portions. The plurality of peripheral portions are disposed adjacent to edges of the central portion. The plurality of peripheral portions are not in contact with each other and with the central portion. The first test pad has a plurality of detection directions, and at least one of the plurality of peripheral portions is disposed in one of the plurality of detection directions. Each of the plurality of second test pads is electrically connected to one of the plurality of peripheral portions through a first connection trace.

10 Claims, 9 Drawing Sheets

FIG. 8A

| determination result / second probe | slightly shifted toward V1 | shifted to an edge toward V1 | seriously shifted toward V1 | slightly shifted toward V2 | shifted to edges toward V2 | seriously shifted toward V2 | slightly shifted toward V8 | shifted to edges toward V8 | seriously shifted toward V8 | slightly shifted toward V7 |
|---|---|---|---|---|---|---|---|---|---|---|
| 2121 |  |  |  |  |  |  |  |  |  | ◎ |
| 2122 |  |  |  |  |  |  |  |  | ◎ |  |
| 2123 |  |  |  |  |  |  |  | ◎ |  |  |
| 2124 |  |  |  | ◎ |  |  |  |  |  |  |
| 2125 | ◎ |  |  |  | ◎ |  |  |  |  |  |
| 2126 |  | ◎ | ◎ |  | ◎ | ◎ | ◎ | ◎ |  |  |
| 2127 |  | ◎ |  |  |  |  |  |  |  |  |

FIG. 8B

| determination result / second probe | shifted to an edge toward V7 | seriously shifted toward V7 | slightly shifted toward V3 | shifted to an edge toward V3 | seriously shifted toward V3 | slightly shifted toward V6 | shifted to edges toward V6 | seriously shifted toward V6 or shifted toward V5 | shifted toward V4 |
|---|---|---|---|---|---|---|---|---|---|
| 2121 | ◎ | | | | | | | | |
| 2122 | ◎ | | | | | | | | |
| 2123 | | ◎ | | | | | | | |
| 2124 | | | | ◎ | | | | | |
| 2125 | | | | | ◎ | | | | |
| 2126 | | | | | | ◎ | ◎ | ◎ | |

SEMICONDUCTOR DEVICE AND METHOD FOR DETECTING NEEDLE MARK SHIFTING

BACKGROUND OF THE INVENTION

Field of the Invention

The invention relates to a detection technology, and in particular, to a semiconductor device and a method for detecting needle mark shifting for instantly detecting whether a probe set is shifted.

Description of the Related Art

It is known that a large number of integrated circuit wafers can be manufactured on a single wafer, and the wafers can be separated through a singulation process for subsequent packaging and usage. Generally, a wafer acceptance test (WAT) is performed on wafers during the period from the completion of all semiconductor processes to the wafer shipment to obtain the electrical characteristics of the wafers. In order to obtain whether there are deficiencies in the process of manufacturing the wafers. In this way, it is possible to ensure the quality and stability of the wafers.

In the wafer acceptance test, a probe set (which may be referred to as a probe card) containing multiple probes is usually used to contact test pads on wafers to feed test signals to obtain the electrical characteristics of the wafers. However, the probe set may slip when it comes into contact with the test pads. It is an uncomfortable test situation that the tips of the probe set are shifted or scratched out of the test pads. Therefore, it is required a mechanism that can monitor the position of the probe application of the probe set in real time to reduce the test risk. In addition, since the available area on a wafer is limited, it is also expected to save as much area as needed for the test.

BRIEF SUMMARY OF THE INVENTION

An exemplary embodiment of the present invention provides a semiconductor device. The semiconductor device comprises a first test pad and a plurality of second test pads. The first test pad comprises a central portion and a plurality of peripheral portions. The plurality of peripheral portions are disposed adjacent to edges of the central portion. The plurality of peripheral portions are not in contact with each other and with the central portion. The first test pad has a plurality of detection directions, and at least one of the plurality of peripheral portions is disposed in one of the plurality of detection directions. Each of the plurality of second test pads is electrically connected to one of the plurality of peripheral portions through a first connection trace.

An exemplary embodiment of the present invention provides a method for detecting needle mark shifting. The method for detecting needle mark shifting comprises a step of a probe set to contact a semiconductor device. The semiconductor device comprises a first test pad and a plurality of second test pads. The first test pad comprises a central portion and a plurality of peripheral portions. The peripheral portions are disposed adjacent to the central portion. The plurality of peripheral portions are not in contact with each other and with the central portion. The central portion has a plurality of detection directions. At least one of the plurality of peripheral portions is disposed in one of the plurality of detection directions. Each of the plurality of second test pads is electrically connected to one of the plurality of peripheral portions through a first connection trace. The probe set comprises a first probe and a plurality of second probes. The first probe is configured to contact the first test pad, and the plurality of second probes are configured to contact the plurality of second test pads. The method for detecting needle mark shifting further comprises steps of outputting a test signal through the first probe; performing a detection using the plurality of second probes to obtain a plurality of detection statuses; and determining a position of a probe application of the probe set according to the plurality of detection statuses.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 8A~8B are schematic diagrams showing a relationship between detection statuses and determination results of a plurality of second probes according to an exemplary embodiment of the present invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
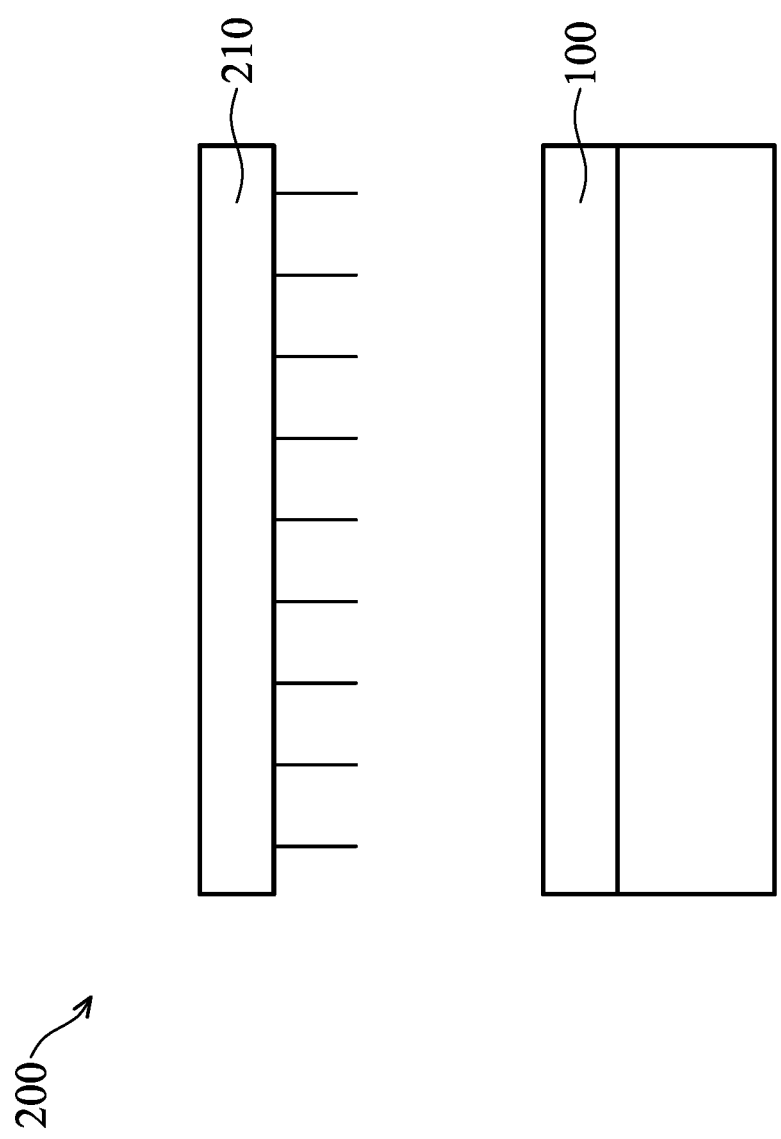
FIG. 1 is a schematic diagram of a detection system and a semiconductor device according to an exemplary embodiment of the present invention.
Figure 2:
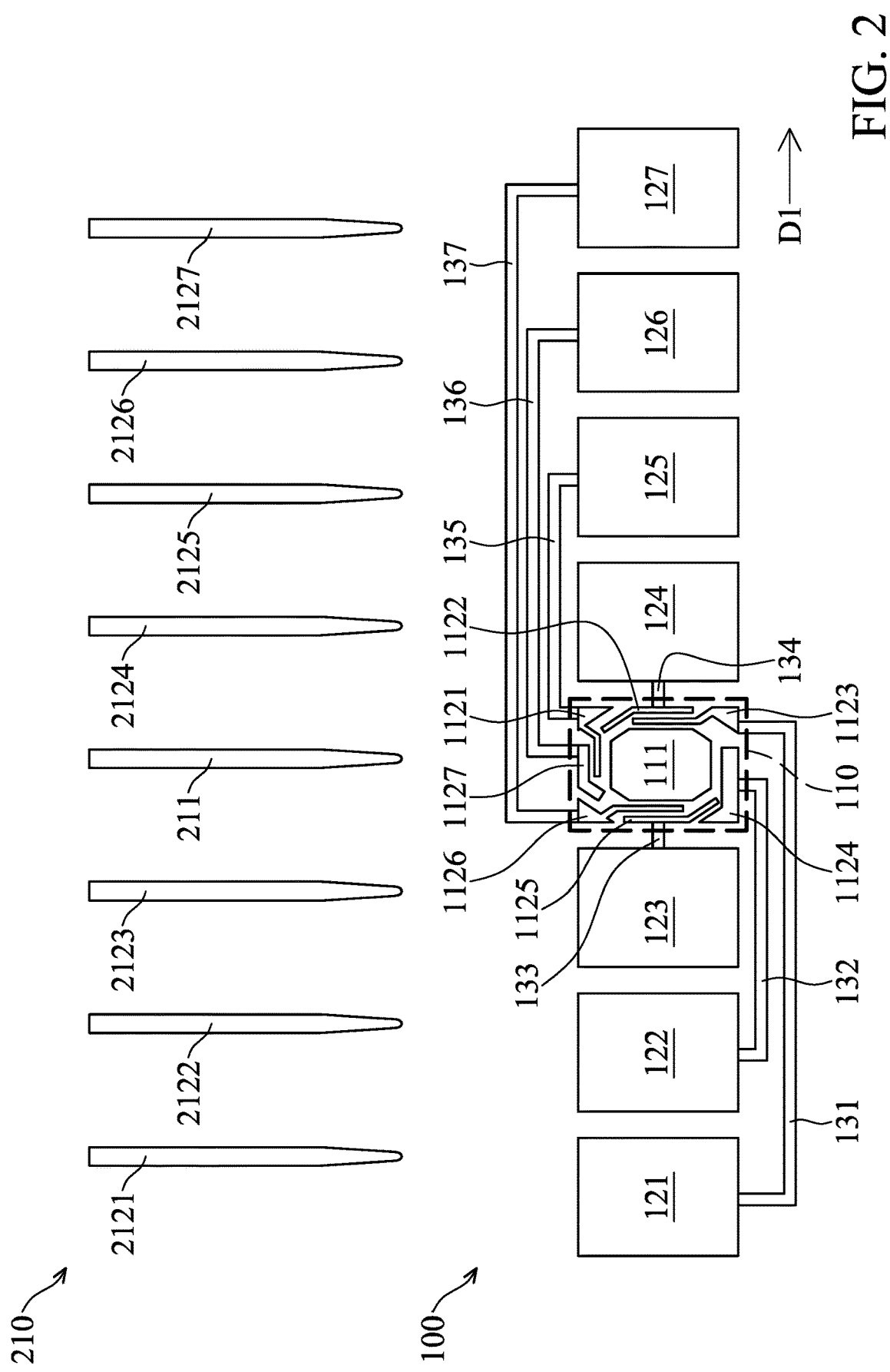
FIG. 2 is a schematic diagram of a semiconductor device and a probe set according to an exemplary embodiment of the present invention.

Referring to FIGS. 1 and 2, a semiconductor device 100 comprises a test pad set. The test pad set may comprise a plurality of test pads, and the plurality of test pads may be divided into a first test pad 110 and a plurality of second test pads. In the following embodiment, eight test pads are taken as an example for description. One of the test pads is the first test pad 110, and the seven test pads are the second test pads 121~127, however, in other embodiments, the number of test pads is not limited thereto. In one embodiment, the required number of second test pads 121~127 may be determined according to the number of peripheral portions of the first test pad 110. In another embodiment, the number of second test pads 121~127 may be more than the number of peripheral portions of the first test pad 110. In some embodiments, the semiconductor device 100 may be a wafer comprising a plurality of integrated circuit wafers, and the first test pad 110 and the plurality of second test pads 121~127 may be disposed in a scribe line of the wafer, however, the present invention is not limited thereto.

A detection system 200 may be configured to perform an electrical detection on the semiconductor device 100, such as a wafer acceptance test (WAT). The detection system 200 may comprise a probe set 210, and the detection system 200 may contact the semiconductor device 100 through the probe set 210 to perform the electrical detection. In one embodiment, the probe set 210 comprises a first probe 211 and a plurality of second probes. In the following embodiment, in response to the number of second test pads 121~127, seven second probes 2121~2127 are taken as an example for description, however, in other embodiment, the number of second probes is not limited thereto.

The first probe 211 is configured to contact the first test pad 110, and each of the second probes 2121~2127 is configured to contact one of the second test pads 121~127. In addition, the first probe 211 and the second probes 2121~2127 of the probe set 210 are moved together, so that when the first probe 211 contacts the first test pad 110, the second probes 2121~2127 contact the second test pads 121~127 respectively. In the embodiment, the detection system 200 may operate to move the probe set 210 vertically downward or move the semiconductor device 100 vertically upward to make the probe set 210 to contact the semiconductor device 100.

It is worth noting that, in order to clearly illustrate the present invention, FIGS. 1 and 2 only show elements related to the present invention. It should be understood that the detection system 200 and the semiconductor device 100 may comprise other components to provide specific functions.

The first test pad 110 comprises a central portion 111 and a plurality of peripheral portions 1121~1127. Hereinafter, the seven peripheral portions 1121~1127 will be taken as an example. When the contact surface of the first test pad 110 is viewed from above, the central portion 111 is located approximately at the center of the contact surface, and the central portion 111 has a certain area, so that the first probe 211 tips the center of the central portion 111, and the needle mark of the first probe 211 may be in the central portion 111. In some embodiments, when the needle tip of the first probe 211 is about 15 micrometers (μm), the needle mark of the first probe 211 may be between 15 micrometers and 20 micrometers. In these embodiments, the length and/or width of the central portion 111 may be between 20 micrometers and 30 micrometers, however, the present invention is not limited thereto.

The plurality of peripheral portions 1121~1127 are disposed adjacent to the edges of the central portion 111 so as to collectively surround the central portion 111. In the embodiment, the plurality of peripheral portions 1121~1127 are spaced from each other, so that they are not directly in contact with contact each other. The plurality of peripheral portions 1121~1127 are further electrically independent from each other. In addition, each of the peripheral portions 1121~1127 is spaced from the central portion 111 and does not directly contact the central portion 111.

Figure 3:
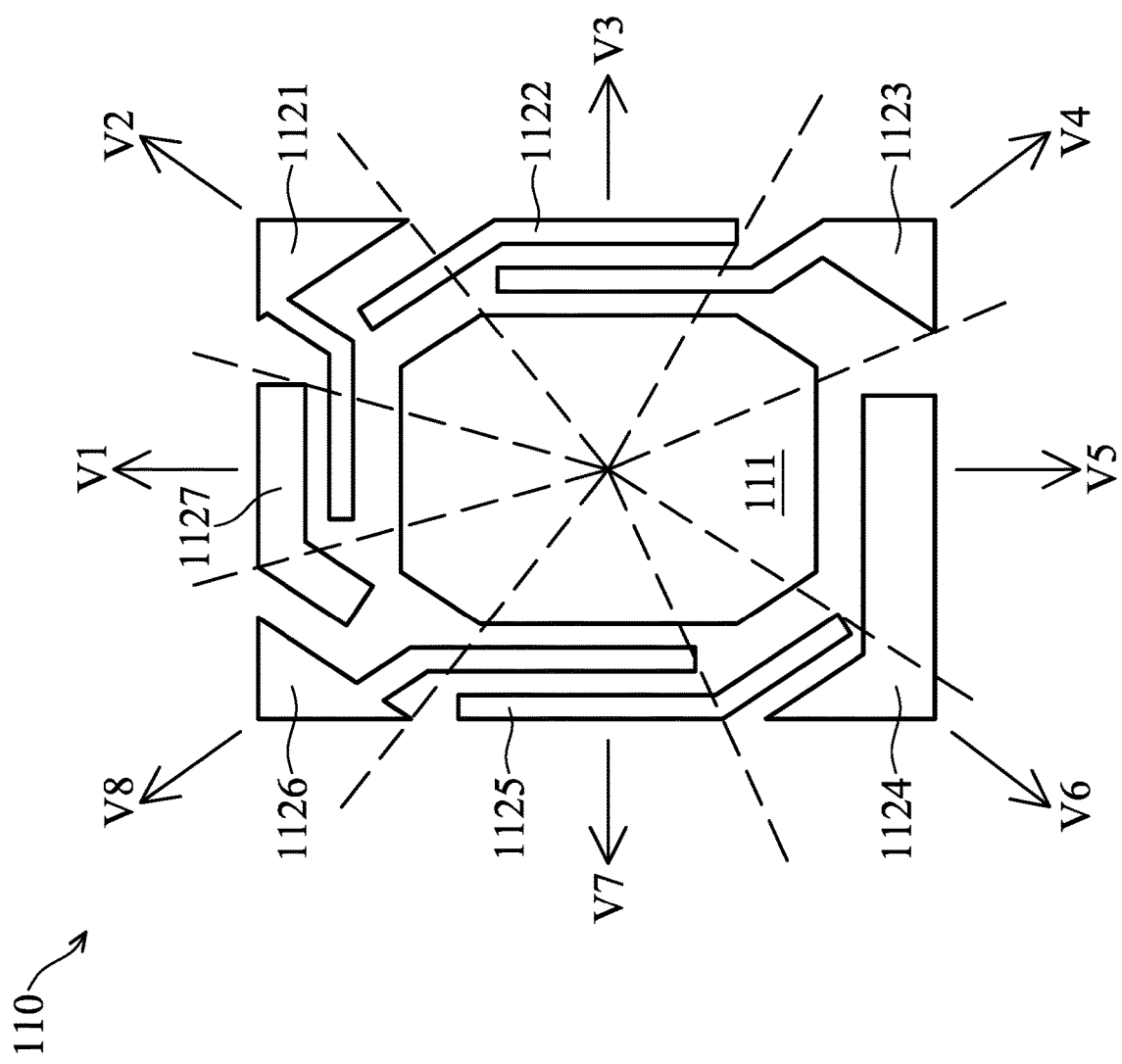
FIG. 3 is a schematic diagram of a first test pad and a detection orientation according to an exemplary embodiment of the present invention.

Please refer to FIG. 2 and FIG. 3, the first test pad 110 may have a plurality of different detection positions. In some embodiments, the number of detection positions may be determined according to the number of sides of the central portion 111 of the first test pad 110. For example, in an embodiment, the central portion 111 of the first test pad 110 may have a rectangular shape with four sides, and the first test pad 110 may have four detection directions V1~V4 which correspond to the orientations of the four sides of the central portion 111. In another embodiment, the central portion 111 of the first test pad 110 may have an octagonal shape, and the first test pad 110 may have eight detection directions V1~V8, which substantially correspond to eight orientations of the eight sides of the central portion 111, respectively, as shown in FIG. 3. However, the present invention is not limited to the above relation between the shape of the central portion 111 and the detection directions of the first test pad 110. The number of detection directions may not correspond to the number of sides of the central portion 111 of the first test pad 110. In addition, the shape of the central portion 111 is not limited to the above shapes, and the central portion 111 may have any suitable shape.

Hereinafter, the eight detection directions V1~V8 are taken as an example for illustration. In the embodiment, the detection directions V1~V8 are in a horizontal orientation parallel to the contact surface. In addition, the first test pad 110 is provided with at least one peripheral portion in each of the detection directions V1~V8, so that the detection system 200 can determine a position of a probe application of the probe set 210 according to which orientation the peripheral portion receiving a signal is in during the detection described later.

The second test pads 121~127 are disposed adjacent to the first test pad 110. In addition, the semiconductor device 100 may further comprise a plurality of first connection traces. In the following, seven first connection traces 131~137 are also taken as an example for illustration in response to the number of second test pads 121~127. Each of the second test pads 121~127 is be indirectly connected to one of the peripheral portions 1121~1127 through the corresponding one of the first connection traces 131~137, so that each of the second test pads 121~127 is electrically connected to the corresponding one of the peripheral parts 1121~1127, as shown in FIG. 2.

In some embodiments, the size of the first test pad 110 (that is, the size of the entire range including the central portion 111 and the peripheral portion 1121~1127, that is, the size of the range occupied by the contact surface) may be substantially equal to the size of the range occupied by the contact face of each of the second test pads 121~127, however, but the present invention is not limited thereto.

The detection system 200 can output a test signal through the first probe 211, detect whether the test signal is received through the second probes 2121~2127, and then can determine the position of the probe application of the probe set 210 based on the detection statuses of the plurality of second probes 2121~2127. Therefore, when the probe set 210 contacts the semiconductor device 100, if the first probe 211 does not tip the central portion 111 of the first test pad 110 completely due to slippage of the probe set 210, for example, if the needle tip of the first probe 211 contacts at least one peripheral portion, the detection system 200 receives the test signal through the at least one corresponding second probe, thereby determining that the position of the probe application of the probe set 210 is shifted. Conversely, if the first probe 211 tips the central portion 111 of the first test pad 110 completely, the detection system 200 determines that the probe set 210 is not shifted because all of the second probes 2121~2127 do not receive any test signal.

Figure 4:
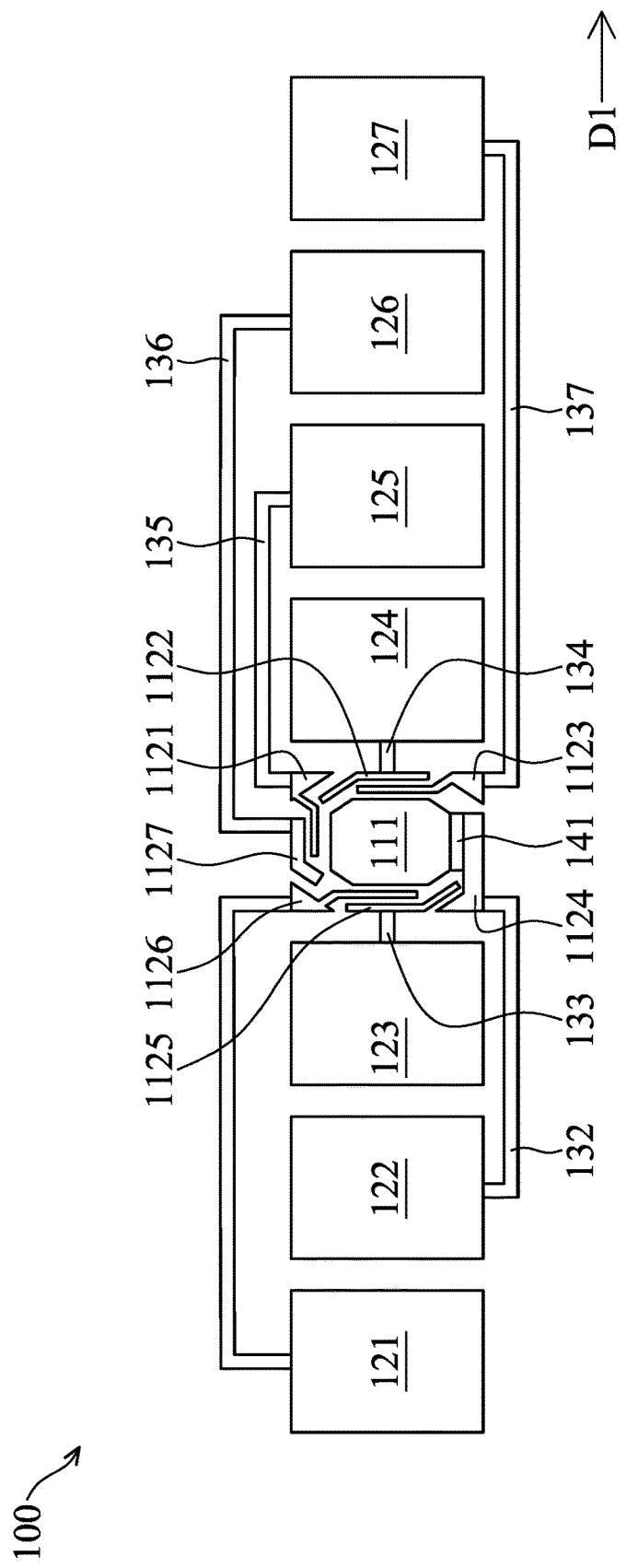
FIG. 4 is a schematic diagram of a semiconductor device according to an exemplary embodiment of the present invention.
Figure 5:
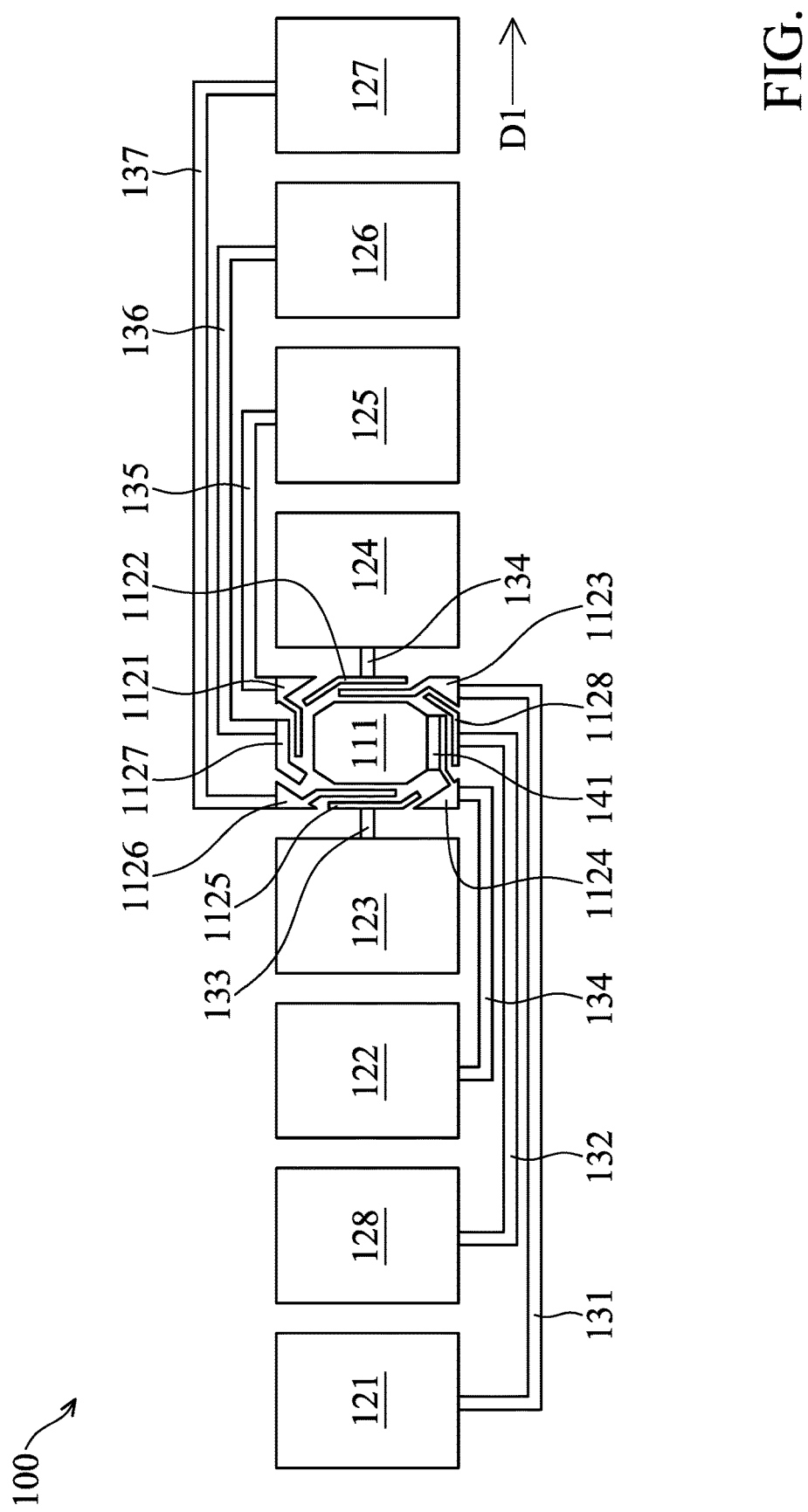
FIG. 5 is a schematic diagram of a semiconductor device according to an exemplary embodiment of the present invention.
Figure 6:
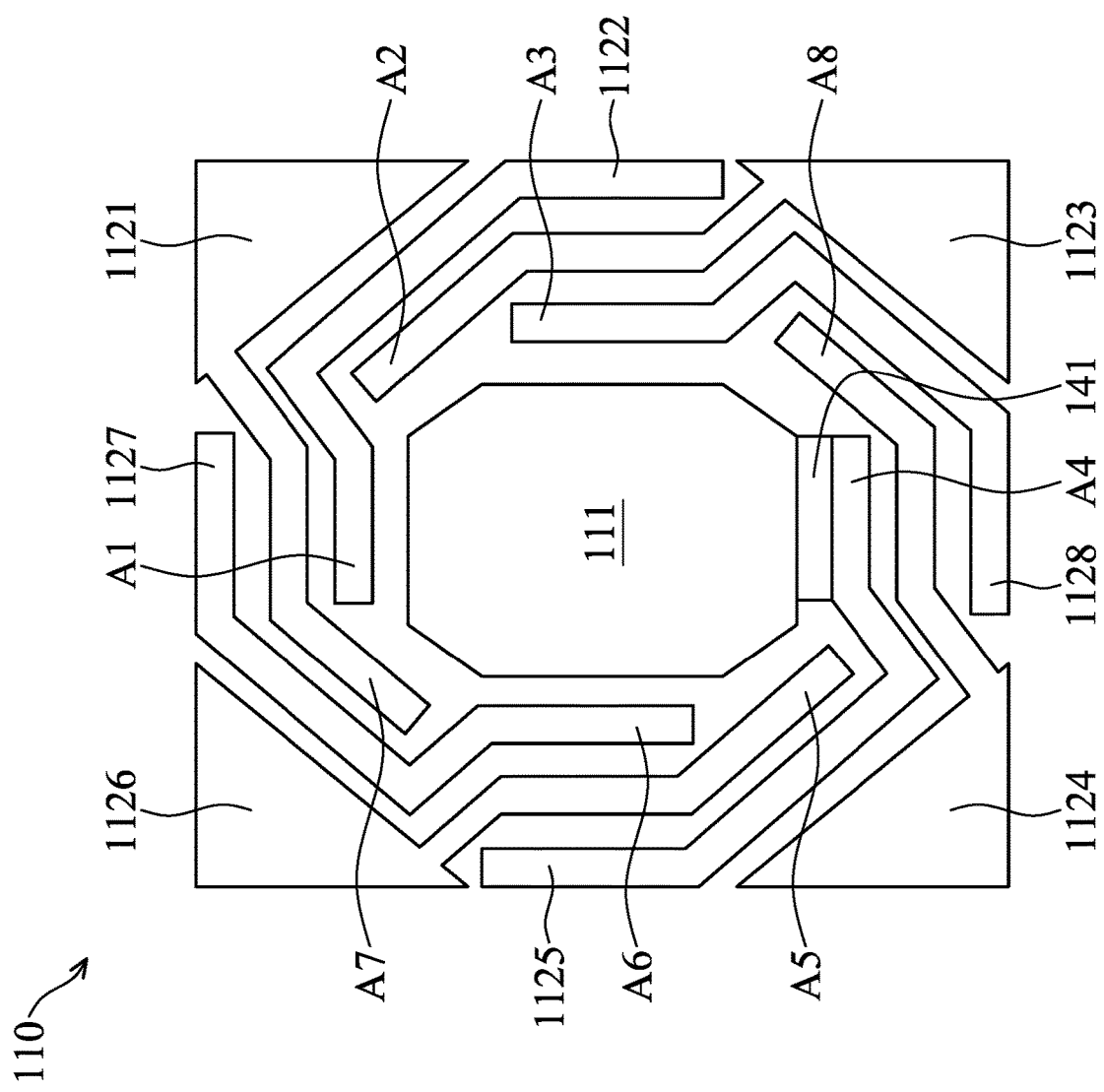
FIG. 6 is a schematic diagram of a first test pad according to an exemplary embodiment of the present invention.

Please refer to FIGS. 4~6, in some embodiments, the semiconductor device 100 may further comprise a second connection trace 141. The second connection trace 141 is connected between the central portion 111 of the first test pad 110 and one of the plurality of peripheral portions 1121~1127 of the first test pad 110, so that the central portion 111 is electrically connected to the corresponding peripheral portions through the second connection trace 141. For example, as shown in FIG. 4, the second connection trace 141 may be connected between the peripheral portion 1124 and the central portion 111. Accordingly, when the probe set 210 contacts the semiconductor device 100, if the first probe 211 tips the central portion 111 of the first test pad 110 completely, the detection system 200 will receive a test signal only through the second probe 2112, thereby determining that the probe set 210 is not shifted instead of that the probe set 210 does not contact the first test pad 110 and the second test pads 121~127 completely. In the following, the first connection pad 110 provided with the second connection trace 141 is taken as an example for description.

In some embodiments, the first test pad 110 (that is, the combination of the central portion 111 and the peripheral portions 1121~1127), the second test pads 121~127, the first connection traces 131~137, and the second connection trace 141 may be manufactured through the same metal layer (such as MO layer, TV layer, etc.) using wafer manufacturing procedures, such as yellow light, etching and other processes. Therefore, the manufacture procedure of the semiconductor device 100 of each embodiment of the present invention is simpler and more convenient than the that of the conventional semiconductors.

The first test pad 110 and the second test pads 121~127 of the semiconductor device 100 may be spaced by intervals along the same arrangement direction D1 and arranged substantially on the same line. In some embodiments, the first test pad 110 may be located between the second test pads 121~127, which is advantageous for the arrangement of the peripheral portions and/or save saves the area of the connection traces connected to the peripheral portions. For example, the first test pad 110 may be substantially located between the second test pads 121~127, however, the present invention is not limited thereto. In other embodiments, the first test pad 110 and the second test pads 121~127 may be arranged in unspecified order as long as the first connection traces 131~137 are connected to the peripheral portions 1121~1127 of the first test pad 110 and the second test pads 121~127. In addition, the first probe 211 and the second probes 2121~2127 of the probe set 210 may be spaced by intervals along the arrangement direction D1 and arranged substantially on the same line.

In some embodiments, each of the peripheral portions 1121~1127 of the first test pad 110 may extend along the edges of the central portion 111 to cover at least two detection directions. For example, as shown in FIG. 4, the peripheral portion 1121 may cover the detection directions V1 and V2, the peripheral portion 1122 may cover the detection directions V2 and V3, and so on.

In other embodiments, as shown in FIG. 5, each of the peripheral portions of the first test pad 110 may cover at least two detection directions in a sequential manner. In the embodiment, the first test pad 110 may comprise eight peripheral portions 1121~1128, and the semiconductor device 100 may also comprise eight second test pads 121~128 correspondingly. As shown in the FIG. 5, the peripheral portion 1121 may cover the detection positions V1 and V2, the peripheral portion 1122 may cover the detection positions V2 and V3, and so on. Based on the above sequential manner, the peripheral portion 1128 may cover the detection positions V8 and V1.

In another embodiment in which each of the peripheral parts 1121~1128 covers three detection positions in a sequential manner, as shown in FIG. 6, the peripheral part 1121 may cover the detection positions V8, V1, and V2, and the peripheral part 1122 may cover Detection orientations V1~V3, and so on.

It should be noted that the first test pad 110 still needs to be divided only eight peripheral portion 1121~1128 and the semiconductor device 100 still comprises only eight second test pads 121~128 regardless of each of the peripheral portions 1121~1128 covering two or three or even eight detection directions in a sequential manner. There are eight peripheral parts 1121 to 1128. Therefore, the area required for the shifting detection can be significantly reduced.

In some embodiments, referring to FIG. 6, each of the peripheral portions 1121~1128, which covers at least two detection directions, may comprise a first configuration section. The first configuration sections A1~A8 of the peripheral portions 1121~1128 are respectively disposed on the detection directions V1~V8, and there is no other peripheral portion between each of the first configuration sections A1~A8 and the central section 111. Accordingly, the peripheral portions 1121~1128 can surround the central portion 111 in a staggered pattern.

In some embodiments, the plurality of detection directions V1~V8 of the first test pad 110 may be divided into high-probability detection directions and low-probability detection directions. Each high-probability detection direction refers to a direction in which the probe set 210 is shifted frequently. In addition, the first test pad 110 may be configured with at least two peripheral portions in a high-probability detection direction, so that the detection system 200 can detect the offset of the probe set 210 in the high-probability detection direction accurately.

Please refer to FIG. 3, for example, the probe set 210 is less shifted downward (eg, the detection direction V5 in FIG. 3) during the probe application. Thus, in some embodiments, only one peripheral portion 1123 is arranged in the detection direction V4, and only one peripheral portion 1124 is arranged in the detection direction V5, and two peripheral portions may be arranged in each of the other detection directions.

The detection system 200 may perform a method for detecting needle mark shifting disclosed by any embodiment of the present invention to monitor the position of the probe application of the probe set 210 on the semiconductor device 100 in real time.

Figure 7:
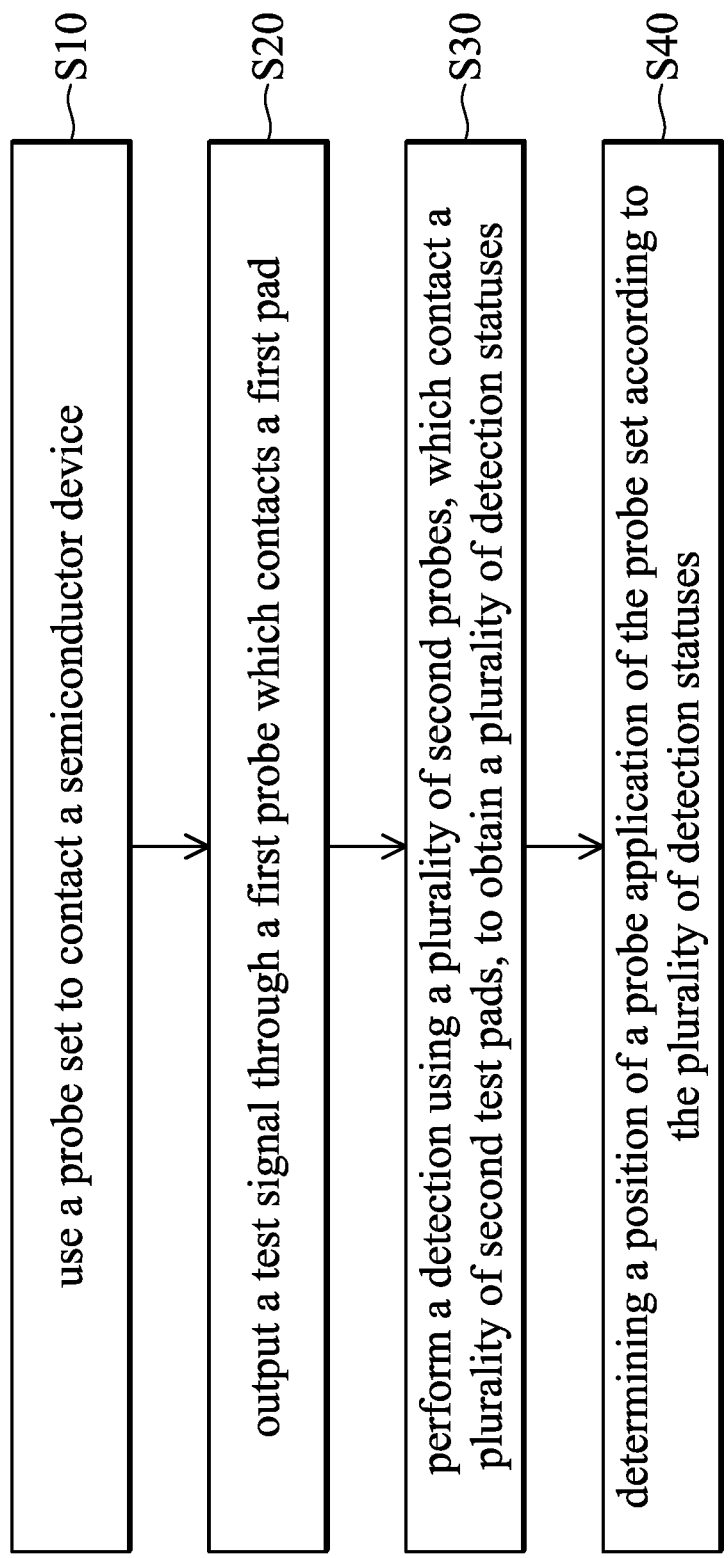
FIG. 7 is a flowchart of a method for detecting needle mark shifting according to an exemplary embodiment of the present invention.

FIG. 7 is a flowchart of a method for detecting needle mark shifting according to an exemplary embodiment of the present invention. Referring to FIG. 7, in one embodiment of the method for detecting needle mark shifting, the detection system 200 may first use the probe set 210 to contact the first test pad 110 and the second test pads 121~127 of the semiconductor device 100 (Step S10). Then, the detection system 200 outputs a test signal through the first probe 211 in the probe set 210 (Step S20) and performs a detection through the second probes 2121~2127 in the probe set 210 to obtain the detection statuses of the second probe 2121~2127 (Step S30). After that, the detection system 200 can quickly determine the position of the probe application of the probe set 210 according to the plurality of detection statuses obtained in step S30 (Step S40). The position of the probe application includes a direction (also referred to as an shifting direction) and/or an offset of the probe application.

In one embodiment of Step S40, the detection system 200 may determine the position of the probe application of the probe set 210 according to at least one detection status indicating that a test signal is received.

In the following, several examples are used to explain how the detection system 200 performs the determination. In one example, when the first probe 211 contacts the central portion 111 and the peripheral portion 1121 shown in FIG. 4, the second probe 2122 that contacts the second test pad 122 and the second probe 2125 that contacts the second test pad 125 receive the test signal. Therefore, the detection system 200 determines that the probe set 210 is shifted toward the detection direction V1. In addition, the second probe 2126 that contacts the second test pad 126 does not receive the test signal, which indicates that the probe set 210 is shifted toward the detection direction V1 but does not leave the contact surface of the first test pad 110. Thus, the system 200 determines that the probe set 210 is only slightly shifted toward the detection direction V1. Moreover, the detection system 200 may estimate the offset of the probe set 210 based on a known pitch (such as, the distance between the peripheral portion 1121 and the central portion 111 here) and the width of the peripheral portion 1121 and then perform a correction operation based on the estimated offset. For example, during the correction operation, the detection system 200 moves the probe set 210 toward the detection direction V5 opposite to the detection direction V1 by the estimated offset.

In an example, when the first probe 211 contacts the central portion 111, the peripheral portion 1121, and the peripheral portion 1127 shown in FIG. 4, the second probe 2122 that contacts the second test pad 122, the second probe 2125 that contacts the second test pad 125, and the second probe 2126 that contacts the second test pad 126 will receive the test signal. Therefore, the detection system 200 determines that the probe set 210 is shifted toward the detection direction V1. In addition, the second probes 2125 and 2126 coupled to the peripheral portions 1121 and 1127 located in the detection direction V1 and the second probe 2122 coupled to the central portion 111 receive the test signal, which indicates that the probes The set 210 is shifted to the edges of the test pads (ie, the first test pad 110 and the second test pads 121~127) toward the detection direction V1. Therefore, the detection system 200 determines that the probe set 210 is shifted to the edges of the test pads toward the detection direction V1. Similarly, the detection system 200 may estimate the offset based on the known distances (such as, the distance between the peripheral portion 1121 and the central portion 111 and the distance between the peripheral portion 1121 and the peripheral portion 1127), the width of the peripheral portion 1121, and the width of the peripheral portion 1127 and then perform correction operation based on the estimated offset.

In an example, when the first probe 211 contacts the peripheral portion 1121 and the peripheral portion 1127 shown in FIG. 4, the second probe 2125 that contacts the second test pad 125 and the second probe 2126 that contacts the second test pad 126 receive the test signal. Therefore, the detection system 200 determines that the probe set 210 is shifted toward the detection direction V1. In addition, the second probe 2122 coupled to the central portion 111 does not receive the test signal, which indicates that the probe set 210 is seriously shifted toward the detection direction V1 (or the second probe 2126 that contacts the second test pad 126, which also indicates that the probe set 210 is seriously shifted toward the detection position V1), so the detection system 200 can judge that the probe set 210 is deviated from the detection position V1 and quickly test out Outside the pad. Similarly, the detection system 200 may estimate the offset of the probe set 210 and then perform a correction operation based on the estimated offset.

Since the detection system 200 determines the shifting in the other detection directions V2~V8 by substantially the same manner as the shifting in the detection direction V1, those with ordinary knowledge in the technical field should understand how to make corresponding modification for the determination of the shifting in the detection directions V2~V8, and the related description is omitted here.

FIGS. 8A~8B are schematic diagrams showing a relationship between detection statuses and determination results of a plurality of second probes according to an exemplary embodiment of the present invention. Please refer to FIG. 2 and FIG. 8, after the detection system 200 applies the method for detecting needle mark shifting for the semiconductor device 100 of the embodiment shown in FIG. 2, an example for a plurality of detection status and the corresponding determination results is obtained, as shown in FIG. 8. The symbol ⊚ indicates that the detection status of the corresponding second probe refers to that a test signal is received.

In summary, the embodiments of the present invention provide a semiconductor device and a method for detecting needle mark shifting. A first test pad is divided to a central portion and a plurality of peripheral portions staggered surrounding the central portion in a staggered pattern, such that a position of a probe application of a probe set can be detected quickly by outputting a test through a first probe and based on a combination of detection statuses of a plurality of second probes. Furthermore, the semiconductor device and the method for detecting needle mark shifting in an embodiment of the present invention can be monitored in real time, so the measurement quality can be guaranteed, and the retest rate of the semiconductor device can be reduced. In addition, the semiconductor device and the method for detecting needle mark shifting in another embodiment of the present invention can greatly reduce the number of second test pads and the occupied area of the second test pads (wire drawing is required for the second test pads), and also simplify the process complexity.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
a first test pad comprising a central portion and a plurality of peripheral portions, wherein the plurality of peripheral portions are disposed adjacent to edges of the central portion, the plurality of peripheral portions are not in contact with each other, the first test pad has a plurality of detection directions, and at least one of the plurality of peripheral portions is disposed in one of the plurality of detection directions; and
a plurality of second test pads, each electrically connected to one of the plurality of peripheral portions through a first connection trace, wherein the first test pad and the plurality of second test pads are arranged along a disposition direction.

2. The semiconductor device as claimed in claim 1, wherein each of the plurality of peripheral portions extends along the edges of the central portion to cover at least two of the plurality of detection directions.

3. The semiconductor device as claimed in claim 2, wherein each of the plurality of peripheral portions comprises a first configuration section, the first configuration section of each of the plurality of peripheral portions is disposed on one of the plurality of detection directions, and, among the plurality of peripheral portions, no peripheral portion is disposed between the first configuration section of one of the plurality of peripheral portions and the central section.

4. The semiconductor device as claimed in claim 1, wherein the plurality of detection directions comprises a plurality of high-probability detection directions, and at least two of the plurality of peripheral portions are disposed on each of the plurality of high-probability detection directions.

5. The semiconductor device as claimed in claim 1, wherein the central portion is electrically connected to one of the plurality of peripheral portions through a second connection trace and further to one of the plurality of second test pads.

6. The semiconductor device as claimed in claim 1, wherein an area occupied by a contact surface of the first test pad is the same as an area occupied by a contact surface of each of the plurality of second test pads.

7. The semiconductor device as claimed in claim 1, wherein the first test pad, the plurality of second test pads, and the first connection traces are manufactured through the same metal layer.

8. A method for detecting needle mark shifting comprising:
  using a probe set to contact a semiconductor device, wherein the semiconductor device comprises a first test pad and a plurality of second test pads, the first test pad comprises a central portion and a plurality of peripheral portions, the peripheral portions are disposed adjacent to the central portion, the plurality of peripheral portions are not in contact with each other, the central portion has a plurality of detection directions, at least one of the plurality of peripheral portions is disposed in one of the plurality of detection directions, each of the plurality of second test pads is electrically connected to one of the plurality of peripheral portions through a first connection trace, the probe set comprises a first probe and a plurality of second probes, the first probe is configured to contact the first test pad, and the plurality of second probes are configured to contact the plurality of second test pads;
  outputting a test signal through the first probe;
  performing a detection using the plurality of second probes to obtain a plurality of detection statuses; and
  determining a position of a probe application of the probe set according to the plurality of detection statuses.

9. The method as claimed in claim 8, wherein determining the position of the probe application of the probe set comprises:
  determining the position of the probe application of the probe set according to at least one of the plurality of detection statuses indicating that the test signal is received.

10. The method as claimed in claim 8, wherein each of the plurality of peripheral portions extends along edges of the central portion to cover at least two of the plurality of detection directions.

* * * * *